PWE23 XR 4,412,147

United States Patent [19]

Nagura et al.

[11] 4,412,147

[45] Oct. 25, 1983

[54] ULTRASONIC HOLOGRAPHY IMAGING DEVICE HAVING A MACROMOLECULAR PIEZOELECTRIC ELEMENT TRANSDUCER

[75] Inventors: Masato Nagura, Chofu; Kazushige Kikuchi, Tokyo; Hiroshi Obara; Yasushi Endo, both of Iwaki, all of Japan

[73] Assignee: Kureha Kagaku Kogyo Kabushiki Kaisha, Tokyo, Japan

[21] Appl. No.: 203,838

[22] Filed: Nov. 4, 1980

[30] Foreign Application Priority Data

Nov. 26, 1979 [JP] Japan ............ 54-152697

[51] Int. Cl.$^3$ ............ H01L 41/00

[52] U.S. Cl. ............ 310/320; 128/660

[58] Field of Search ............ 128/660, 675; 252/62.9; 333/193, 195, 186, 187; 310/800, 320; 367/157; 73/632, 620; 311/317; 318/116, 118

[56] References Cited

U.S. PATENT DOCUMENTS

| | | | |
|---|---|---|---|
| 3,564,904 | 2/1971 | Brenden et al. | |
| 3,973,235 | 8/1976 | van der Burgt | 340/5 MP |
| 3,990,296 | 11/1976 | Erikson | 73/67.5 H |
| 4,123,681 | 10/1978 | Barlow | 310/322 |
| 4,268,653 | 5/1981 | Uchidoi et al. | 526/255 |
| 4,296,349 | 10/1981 | Nakanishi et al. | 310/335 |

*Primary Examiner*—J. D. Miller
*Assistant Examiner*—D. Rebsch
*Attorney, Agent, or Firm*—Sughrue, Mion, Zinn, Macpeak and Seas

[57] ABSTRACT

An ultrasonic image device such as may be used in a holography system or scanning system and having a piezoelectric transducer in which the conversion efficiency and phase are substantially constant over a wide frequency range. A piezoelectric sheet 5 μm to 1000 μm thick is used for a piezoelectric element. The piezoelectric sheet is constructed of a macromolecular material including polymers and copolymers of polar monomers. A high frequency signal input device applies to the electrodes coupled to the piezoelectric sheet high frequency signals of different frequencies in a range around a fundamental resonance of the piezoelectric sheet of ±10 to ±70% of the fundamental resonance frequency.

3 Claims, 4 Drawing Figures

ULTRASONIC HOLOGRAPHY IMAGING DEVICE HAVING A MACROMOLECULAR PIEZOELECTRIC ELEMENT TRANSDUCER

BACKGROUND OF THE INVENTION

The present invention relates to ultrasonic imaging devices. More specifically, the invention relates to an ultrasonic imaging device for providing a clear image by sweeping while varying the transmission ultrasonic frequency or by superposing ultrasonic waves of different frequency. The device uses a macromolecular piezoelectric element as a transducer.

Ultrasonic imaging devices are now used in ultrasonic microscopes, ultrasonic diagnosis devices, or ultrasonic flaw detectors, for instance. These ultrasonic imaging devices can be classified into various groups according to the mechanism used. In one of the groups, images are formed by receiving ultrasonic waves reflected by objects. In another group, images are formed by receiving ultrasonic waves transmitted through objects. In still another group, images are formed by receiving both ultrasonic waves reflected by and transmitted through objects. In yet another group, ultrasonic holography is employed in which an ultrasonic hologram is formed by applying a reference wave to an ultrasonic wave reflected by or passed through an object which is then used to form a visible image through an acousto-optic effect.

An ultrasonic wave is greatly attenuated when it passes through a medium. The higher the frequency and the shorter the wavelength, the higher the attenuation. Therefore, an ultrasonic wave of excessively high frequency cannot be used to observe the interior of an object to be examined. For instance, the highest ultrasonic frequency used by an ultrasonic diagnosis device is limited to about ten and several MHz even for examining portions near a surface layer and to about several MHz for examining deeper layers. It is well known in the art that the resolution of the ultrasonic image device is inversely proportional to the wavelength. As the operating frequency is limited as described above, the resolution of these devices is correspondingly limited. In passing through an object to be examined, an ultrasonic wave is diffracted or delayed. Thus, the resultant waves interfere with one another or are irregularly reflected thus creating noise which appears as light and shaded portions or "ghosts". In addition to this, because of factors attributed to the device itself, the actual resolution is lower than the theoretical resolution as determined from the wavelength of the ultrasonic wave. The effective resolution is often several times the wavelength of an ultrasonic wave used.

A method of preventing reduction of resolution caused by noise due to the above-described interference has been described, for instance, in "Acoustical Holography", 5, 373-390 (1974) in an article by Korpel et al. The principle of that method is that, if the wavelength of a generated ultrasonic wave is continuously or stepwise changed so that an image is formed by ultrasonic waves of different wavelength, the noise effects corresponding to the different ultrasonic waves are different from one another. Therefore, only the desired image is emphasized, thereby resulting in a clear image. It is obvious that the principle can be applied to the case where ultrasonic waves of different wavelength are simultaneously generated in superposition. Furthermore, a method in which ultrasonic holograms having various wavelengths obtained by applying a plurality of ultrasonic beams to an object simultaneously or according to a predetermined sequence are made to correspond to light of different hues to form a colored image has been proposed, for instance, in U.S. Pat. No. 3,564,904. Such a colored image can be obtained not only by holography but also with a method in which, in receiving an ultrasonic image with a transducer, received ultrasonic waves of different wavelength are displayed with different colors. Moreover, satisfactory results can be obtained using the method disclosed by Korpel et al or the method disclosed in U.S. Pat. No. 3,564,904 with the ultrasonic frequency range set as large as possible.

A conventional ultrasonic imaging device, in general, employs a non-organic piezoelectric element such as a PZT or a crystal as its ultrasonic transducer. The fundamental resonance frequency $f_0$ of a piezoelectric element used as an ultrasonic transducer is:

$$f_0 = v/2l, \qquad (1)$$

where l is the thickness of the piezoelectric element and v is the acoustic velocity in the piezoelectric element, in which piezoelectricity of thickness expansion mode is used.

A non-organic piezoelectric element has a conversion efficiency A of several tens of percent in the vicinity of the fundamental resonance frequency $f_0$. The conversion efficiency A is defined by equation (2).

$$A\,(\%) = \frac{\text{(acoustic power)}}{\text{(electrical power)}} \times 100$$

However, the conversion efficiency A abruptly decreases on either side of the fundamental resonance frequency $f_0$, that is, the peak conversion efficiency A is obtained at the fundamental resonance frequency $f_0$.

FIG. 1 shows an example of a measurement which is carried out for determining the variations in conversion efficiency A of a transducer having a piezoelectric element of lead niobate by varying the frequency with the electrical power maintained constant. In FIG. 1, the conversion efficiency A at the fundamental resonance frequency $f_0$ has a maximum value $A_{max}$. As is apparent from FIG. 1, the frequency range in which the conversion efficiency A has values higher than a half of the value $A_{max}$ is only about 0.6 MHz. Within this frequency range, the conversion efficiency changes considerably abruptly with frequency and therefore received images obtained at the generated frequencies differ in clarity from one another with the result that processing the images is rather difficult.

For a non-organic piezoelectric element of lead niobate or PZT, the impedance and the phase thereof change greatly away from the fundamental resonance frequency $f_0$ as indicated in FIG. 2. Therefore, if the frequency is varied significantly around $f_0$, matching a high frequency device driving the transducer to the transducer is of considerable difficulty, and accordingly the necessary means for adjusting or controlling the device is complex. Thus, it is difficult to frequently change the frequency. If the frequency is varied in a range in which at least the phase and the conversion efficiency do not vary much so that the frequency range of the transducer is defined by the maximum conversion efficiency $A_{max}$ and $A_{max}/2$ in that range, then the frequency variation of the lead niobate transducer falls substantially within 3±0.3 MHz.

SUMMARY OF THE INVENTION

Accordingly, it is an object of the present invention to provide an ultrasonic holography imaging device, in which the conversion efficiency of the transducer does not change abruptly with frequency and in which received images for different frequencies do not differ greatly in quality from one another.

Moreover, it is an object of the present invention to provide such an ultrasonic imaging device in which the phase and conversion efficiency do not vary substantially over a wide frequency range.

In accordance with these and other objects of the invention, there is provided an ultrasonic imaging device including a transducer having a piezoelectric element constructed of a macromolecular piezoelectric sheet 3 μm to 1000 μm in thickness. The piezoelectric sheet has electrodes disposed on both sides thereof. A high frequency signal superposition input device or high frequency signal sweep device applies to the electrodes high frequency signals of different frequencies simultaneously or stepwise in a frequency range around a fundamental resonance frequency of the piezoelectric sheet of ±10% to ±70% of the fundamental resonance frequency. The piezoelectric sheet is constructed of a macromolecular material, particularly, polymers and copolymers of polar monomers. More specifically, the preferred material for the piezoelectric sheet is at least one material selected from the group consisting of vinylidene fluoride, vinyl fluoride, trifluoroethylene and fluorochlorovinylidene.

DESCRIPTION OF THE PREFERRED EMBODIMENTS

Figure 1:
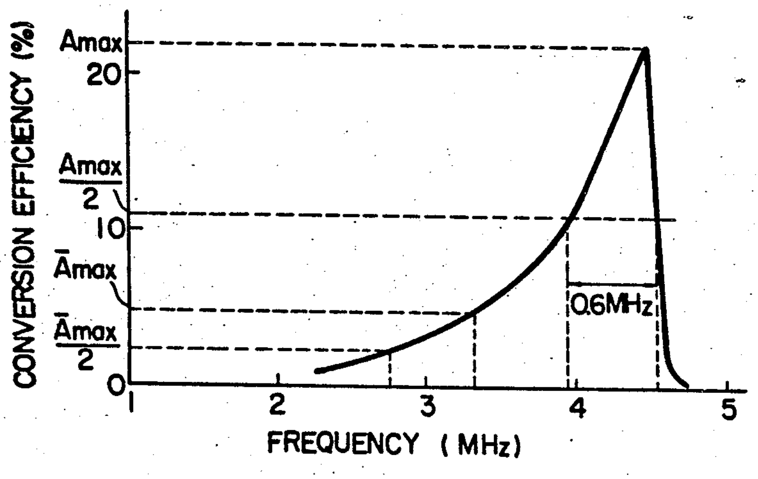
FIGS. 1 and 2 are graphical representations indicating the conversion efficiency and the impedance and phase characteristics of a lead niobate type transducer, respectively.

The inventors have conducted research into the use of a macromolecular piezoelectric element of a material such as polyvinylidene fluoride instead of the conventional non-organic piezoelectric element as a transducer in such an ultrasonic image device in which frequency variation or superposition is carried out. As a result of this research, it has been found that while the electromechanical coupling coefficient of a good quality non-organic piezoelectric element is over 50%, that of a macromolecular piezoelectric element is very small, not more than 20%, and accordingly the ultrasonic output of the latter is small. By comparing the maximum output of the macromolecular piezoelectric element with that of the non-organic piezoelectric element, the conclusion has been reached that the former is not suitable as a transducer for an ultrasonic image device. Specifically, in varying the frequency, a non-organic piezoelectric element involves the above-described difficulties. On the other hand, for a transducer using a macromolecular piezoelectric element, its $A_{max}$ value is smaller than that of the non-organic piezoelectric element but its frequency conversion efficiency curve is relatively flat. Accordingly, the macromolecular piezoelectric element has a wide frequency range in which the conversion efficiency is greater than $A_{max}/2$, and it has a much smaller impedance and phase variation. It should be noted that even in the range smaller than $A_{max}/2$, the macromolecular piezoelectric element is applicable due to the small conversion efficiency and phase variation. Thus, the inventors have found that the use of a macromolecular piezoelectric element type transducer is very advantageous, compared with the conventional non-organic piezoelectric element type transducer.

A specific feature of the invention resides in an ultrasonic image device and the transducer employed therewith in which a piezoelectric element forming the transducer is a macromolecular piezoelectric sheet 3 to 1000 μm in thickness and a high frequency signal multiple input device or a high frequency signal sweep device is provided which applies a plurality of high frequency signals in a frequency range of the fundamental resonance frequency of the piezoelectric sheet ±10 to ±70% simultaneously or successively to electrodes on both sides of the piezoelectric sheet.

The macromolecular piezoelectric element used in the invention is constructed by subjecting to polarization under high voltage electric field a sheet of polymer or copolymer which contains essentially at least one of the polar monomers such as vinylidene fluoride, vinyl fluoride, trifluoroethylene and fluorochlorovinylidene.

The thickness of the macromolecular piezoelectric element used is from 3 μm to 1000 μm. The use of a macromolecular piezoelectric element of less than 3 μm in thickness makes it difficult to form a uniform film of high piezoelectric modulus. The use of a film greater than 1000 μm in thickness is not practical because its fundamental frequency is lower than 1 MHz and accordingly the resolution of the resultant ultrasonic image is low. The range of thickness of the macromolecular piezoelectric element is further limited when the attenuation of an ultrasonic wave or the purpose of use of the device is taken into consideration. For an ordinary ultrasonic microscope, the thickness of an object is not very large. However for an ultrasonic microscope requiring a high resolution, the thickness of a piezoelectric element is preferably 3 to 50 μm. For an ultrasonic flaw detector or an ultrasonic diagnosis device, the thickness is preferably 50 to 1000 μm because the coupling of the ultrasonic waves to the interior of the body is the most essential consideration.

In the transducer, electrodes are provided on both sides of the macromolecular piezoelectric element and, if necessary, a sound reflecting plate such as a metal plate or a ceramic plate or a sound absorbing plate such as a rubber plate or a plastic plate is provided on the rear side of the macromolecular piezoelectric element. In the case where it is intended that the transducer be used in water, it is preferable that at least one of the electrodes of the macromolecular piezoelectric element be insulated with a film made of a material such as silicon rubber which is impermeable to water.

A high frequency electric source circuit is coupled to the electrode circuit of the transducer for exciting the transducer with ultrasonic waves. The high frequency electric source circuit is provided with a high frequency signal superposition input device having a plurality of high frequency oscillating circuits producing signals of different frequency or a high frequency signal sweep device of which the output frequency varies continuously or stepwise. The input frequency range should be from the fundamental resonance frequency defined by the thickness of the piezoelectric element used in the transducer to ±10 to ±70% of the fundamental resonance frequency, i.e., from 110% to 170% 90% to 30% of the fundamental resonance frequency. If the input frequency range is smaller than a range of from the fundamental resonance frequency to within ±10% thereof, the frequency range occupied by superposition or sweep frequencies is small and therefore the effect of making the obtained images clear is not strongly evinced. In the range of up to ±10%, a lead niobate or PZT type transducer may be employed for frequency variation. In the range of ±10% to ±15%, the conversion efficiency change of a non-organic piezoelectric element such as a PZT, due to the higher and lower frequency wavelengths, is large and therefore the use of a non-organic piezoelectric element is not desirable although PZT may be usable at some cost in some situation. In the input frequency range of ±15% of the fundamental resonance frequency, a macromolecular piezoelectric element according to the invention is far more advantageous than a non-organic piezoelectric element. Preferably, the upper limit of the input frequency range should be ±15 to ±50% of the fundamental resonance frequency because, if the frequency is excessively large, the conversion efficiency and the permeability of the waves through an object to be examined greatly vary.

The transducer according to the invention is advantageous in that the clarity of images is improved as described above due to the use of the macromolecular piezoelectric element. An ultrasonic image device is often used in a situation in which the object to be examined is placed in water or the ultrasonic waves are applied to an object to be examined through a water layer in which case the ultrasonic waves must propagate through a water layer. The acoustic impedance of a macromolecular piezoelectric element, being a fraction of the acoustic impedance of a non-organic piezoelectric element, is very close to the acoustic impedance of water. Therefore, a macromolecular piezoelectric element acoustically matches satisfactorily with water, and accordingly the ultrasonic waves in the interface between the element and the water suffer a much smaller reflection loss than in the previously-used construction. Accordingly, when the ultrasonic waves propagate through a water layer, the conversion efficiency ratio is five or six times (in the case of transmission only) to fifteen or sixteen times (in the case of transmission and reception wherein the ultrasonic waves pass through the interface) as high as that of the piezoelectric elements. In addition, a transducer of uniform thickness and large area can be readily manufactured because of the employment of the above-described macromolecular piezoelectric element.

EXAMPLE

A transducer hereinafter referred to as a transducer A was manufactured as follows. A uniaxially oriented polyvinylidene fluoride piezoelectric sheet with a thickness of 320 μm, a width of 4 cm and a length of 6 cm having a piezoelectric constant $d_{33}=5\times10^{-7}$ c.g.s.e.s.u. was subjected to aluminum vacuum evaporation to provide electrodes. The sheet was bonded to a bakelite plate of size 10 cm×10 cm×2 cm with an epoxy adhesive and a silicon resin coating layer 2 mm in thickness was formed on the surface. Lead wires were extended from the electrodes through the coating layer.

Figure 3:
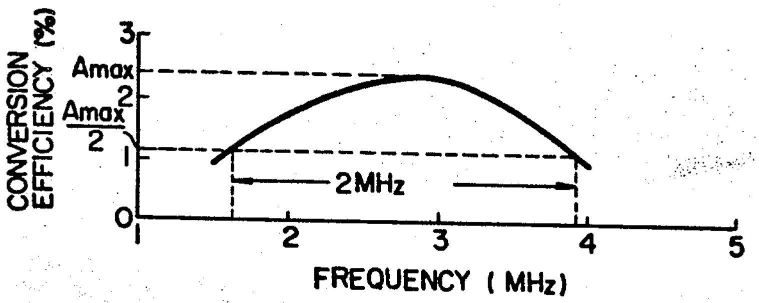
FIGS. 3 and 4 are also graphical representations indicating the conversion efficiency and the impedance and phase characteristics of a macromolecular piezoelectric element type transducer according to the invention.
Figure 4:
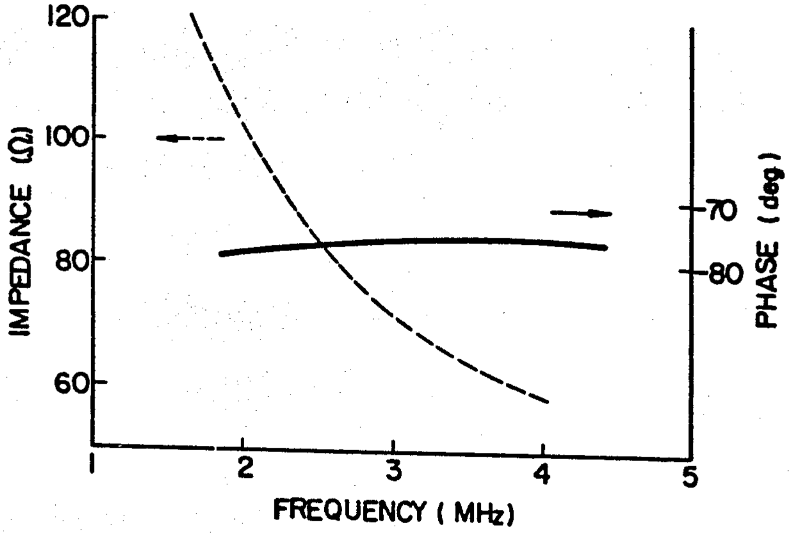

The impedance and phase characteristics of the transducer were measured with a vector impedance meter and the measurement results are as indicated in FIG. 4. The electro-acoustic conversion efficiency of the transducer was measured with a balance type radiation pressure meter (as described, for example, in J. Phys. Soc. Japan 3, (1948), 47) and the measurement results are as shown in FIG. 3.

Figure 2:
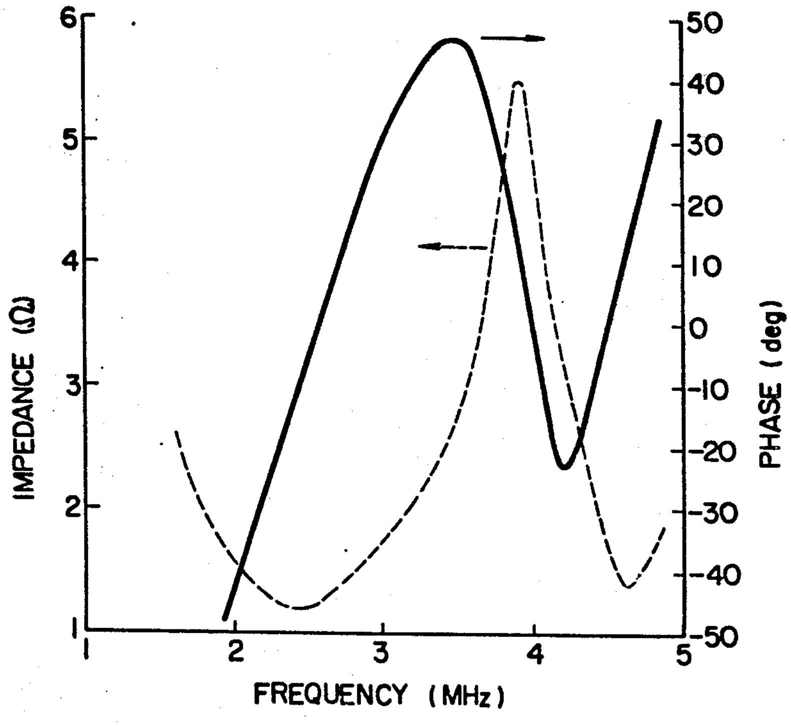

A transducer, hereinafter referred to as a transducer B, was manufactured as a comparison example using a ceramic of lead niobate piezoelectric element having a thickness of 400 μm, a width of 7 cm and a length of 7 cm having a piezoelectric constant $d_{33}=20\times10^{-7}$ c.g.s.e.s.u. Similarly as with the transducer A, the characteristics of the transducer B were measured and the measurement results are as indicated in FIGS. 2 and 1.

Each of the transducers was used as an object wave transducer in a holography device (Kanebo Model KM-101) having a frequency sweep capability and the resultant images in the two cases were compared with each other. The pulse width and the repetitive period of the high frequency exciting pulses used were 180 μsec and 150 pps, respectively, and a frequency sweep in five steps at equal intervals was carried out. With the transducer A, a sweep width of ±500 KHz with a central frequency $f_0$ of 2.5 MHz was readily obtained. The transducer A was operable in practice with a sweep width of ±1 MHz. For the transducer B, the sweep width was ±150 KHz under the same conditions and the practical operable limit was ±300 KHz.

For the image comparison test, the resolutions were measured using a bakelite plate drilled at predetermined intervals. With the transducer A used with a sweep width of ±500 KHz, the resultant image could be resolved to intervals 1.4 mm. On the other hand, in the case where the transducer B was used with a sweep width of ±150 KHz, the resultant image could be resolved only to intervals 2.3 mm and generally was noisy.

Images of a human hand formed using the transducers A and B similar as in the above-described case were compared. The image taken with the transducer A was found to be clear as to detailed portions thereof compared with the image taken with the transducer B. In the above-described measurements, a lead niobate type transducer provided in the holography device was used as a hologram forming reference wave transducer. However, if that transducer were replaced by a macromolecular piezoelectric element type transducer, the clearness of the image would be expected to be improved.

With an ultrasonic image device or an ultrasonic microscope employing a scanning system in which the reflection wave or transmission wave of a scanned ultrasonic beam is received by the same transducer or a different transducer, the effects provided by frequency sweeping are the same as those with the above-described holography system ultrasonic image device. Therefore, if these devices are used with a macromolecular piezoelectric element type transducer constructed according to the invention, the same advantageous effects as those in the holography system ultrasonic image device are obtainable.

What is claimed is:

1. An ultrasonic holography imaging device comprising; a transducer having a macromolecular piezoelectric sheet with a thickness in the range of 3 μm to 1000 μm; a high frequency signal sweeping device for applying an oscillation high frequency signal to said transducer while changing its frequency sequentially continuously or stepwise, wherein a plurality of high frequencies in the range of from 0.3 $f_0$ to 0.9 $f_0$ or 1.1 $f_0$ to 1.7 $f_0$ are inputted to said transducer by said high frequency signal sweeping device, where; l is the thickness of a piezoelectric sheet, v is an acoustic velocity in said piezoelectric sheet, and $f_0$ is a fundamental resonance frequency expressed by v/2l.

2. The device as claimed in claim 1 wherein said piezoelectric sheet is constructed of a material selected from the group consisting of polymers and copolymers of polar monomers.

3. The device as claimed in claim 1 wherein said piezoelectric sheet is constructed from at least one material selected from the group consisting of vinylidene fluoride, vinyl fluoride, trifluoroethylene and fluorochlorovinylidene.

* * * * *